United States Patent
Tsai et al.

(10) Patent No.: US 10,168,359 B2
(45) Date of Patent: Jan. 1, 2019

(54) PROBE CARD FOR HIGH VOLTAGE TESTING

(71) Applicant: MPI Corporation, Hsinchu County (TW)

(72) Inventors: Chin-Yi Tsai, Hsinchu County (TW); Chien-Hung Chen, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 0 days.

(21) Appl. No.: 15/460,246

(22) Filed: Mar. 16, 2017

(65) Prior Publication Data
US 2017/0299629 A1 Oct. 19, 2017

(30) Foreign Application Priority Data
Apr. 18, 2016 (TW) .............................. 105112028 A (51) Int. Cl.
*G01R 1/067* (2006.01)
(52) U.S. Cl.
CPC ................................ *G01R 1/06777* (2013.01)
(58) Field of Classification Search
CPC ............ G01R 31/2889; G01R 1/06777; G01R 1/07378
See application file for complete search history.

(56) References Cited

U.S. PATENT DOCUMENTS 7,436,195 B2 * 10/2008 Ruckenbauer ..... G01R 31/2891
324/750.19
7,562,617 B2 * 7/2009 Di Stefano .......... G01R 1/0433
92/91
2014/0002118 A1 † 1/2014 Gaggl

FOREIGN PATENT DOCUMENTS

TW          201142304 A1    12/2011
WO       2015/106302 A1 †   7/2015

OTHER PUBLICATIONS

Rainer Gaggl, Ph.D., "Under Pressure"—from High Voltage to MEMS Pressure Sensors Wafer Probing,IEEE Semiconductor Wafer Test Workshop, Jun. 8-11, 2008, San Diego, CA, USA.*

* cited by examiner
† cited by third party

*Primary Examiner* — Walter L Lindsay, Jr.
*Assistant Examiner* — Milton Gonzalez
(74) *Attorney, Agent, or Firm* — CKC & Partners Co., Ltd.

(57) ABSTRACT

A probe card includes a wiring board, a top cover, a retractable structure and a probe. The top cover couples with the wiring board and has an air inlet. The retractable structure connects with the top cover and includes a first and a second rings. The first ring has vent holes. A top surface of the first ring and a first bottom surface of the top cover define a homogenized space communicating with the air inlet and the vent holes. The second ring couples with the first ring and has jet holes communicating with the vent holes. Outlets of the jet holes locate on a second bottom surface of the second ring. A first inner sidewall of the first ring and a second inner sidewall of the second ring define a pressure space. The probe connects with the wiring board and extends to the pressure space.

15 Claims, 11 Drawing Sheets

PROBE CARD FOR HIGH VOLTAGE TESTING

RELATED APPLICATIONS

This application claims priority to Taiwanese Application Serial Number 105112028 filed Apr. 18, 2016, which is herein incorporated by reference.

BACKGROUND

Technical Field

The present disclosure relates to probe cards. More particularly the present disclosure relates to a probe cards suitable to be utilized in a high pressure environment in a high voltage test.

Description of Related Art

The main function of a probe card is to directly contact with the welding pads or bumps on a device under test (such as a wafer, a chip or a die) with its probe, in order to achieve the purpose of testing the device under test with the configuration of a tester or software control, such that defective products can be screened. In general, a testing signal is generated from the tester, and the testing signal reaches the device under test through the probe card. Afterwards, a signal of testing result is transmitted back to the tester through the probe card for analysis. In case of a high voltage test (such as a voltage higher than 500 volt), the probe card should be suitable to be utilized in a high pressure environment (such as a pressure higher than three times of the atmospheric pressure) in order to increase the high voltage tolerance and to improve the testing performance and efficiency, which is an issue to be improved in the technology nowadays.

SUMMARY

A technical aspect of the present disclosure provides a probe card which is suitable to be used in a high gas pressure environment to increase the high voltage tolerance and to improve the testing performance. Moreover, the damage of the device under test due to the contact with device under test is avoided.

According to an embodiment of the present disclosure, a probe card includes a wiring board, a top cover, a retractable structure and at least one probe. The top cover is coupled with the wiring board. The top cover has at least one air inlet therein. The retractable structure is connected with the top cover. The retractable structure includes a first ring and a second ring. The first ring has a plurality of vent holes therein. The top cover has a first bottom surface facing to the first ring. The first ring has a top surface facing to the top cover. The top surface of the first ring and the first bottom surface of the top cover together define a homogenized space. The homogenized space communicates with the air inlet of the top cover and the vent holes of the first ring. The second ring is movably coupled with the first ring. The second ring has a plurality of jet holes therein. The jet holes communicate with the vent holes. The second ring has a second bottom surface opposite to the top cover. Outlets of the jet holes are located on the second bottom surface of the second ring, in which a first inner sidewall of the first ring and a second inner sidewall of the second ring together define a pressure space. The probe is electrically connected with the wiring board and extends to the pressure space.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same, or like parts.

Unless otherwise defined, all terms (including technical and scientific terms) used herein have the same meaning as commonly understood by one of ordinary skills in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
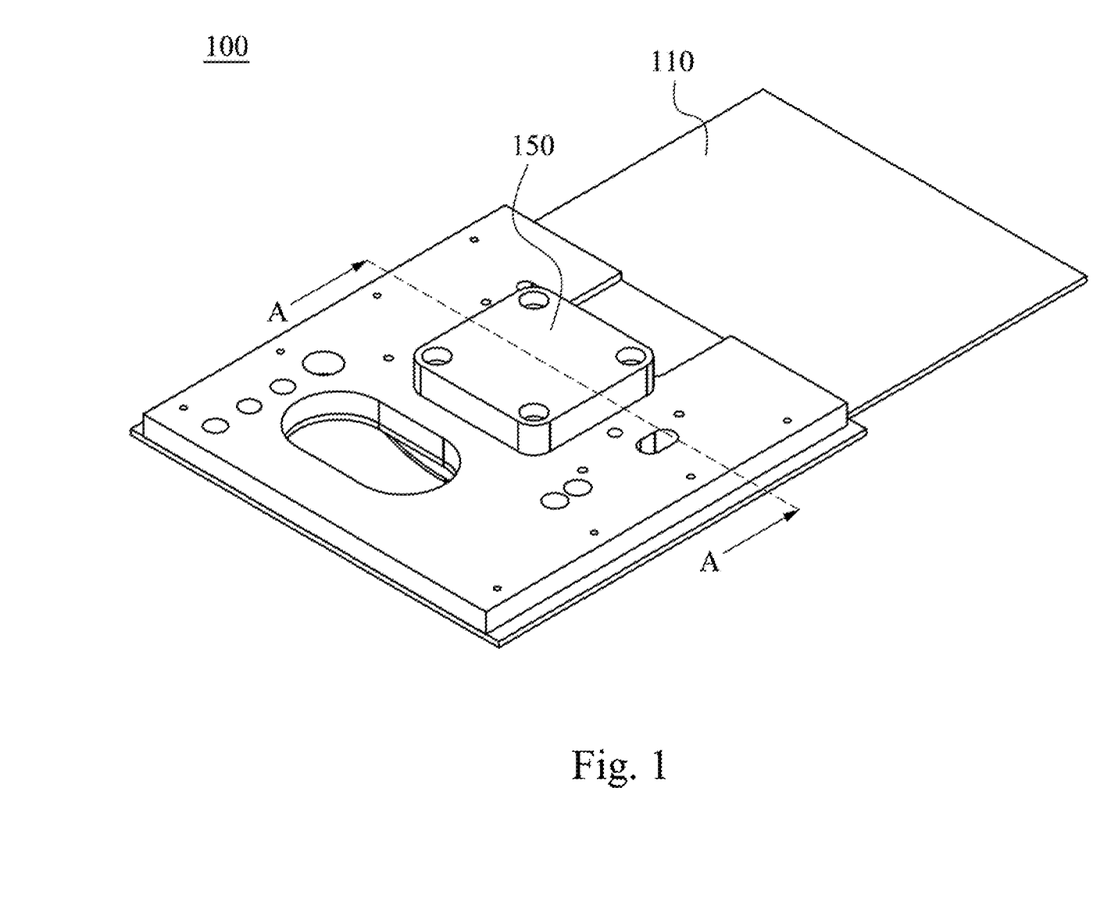
FIG. 1 is a perspective top view of a probe card according to an embodiment of the present disclosure.
Figure 2:
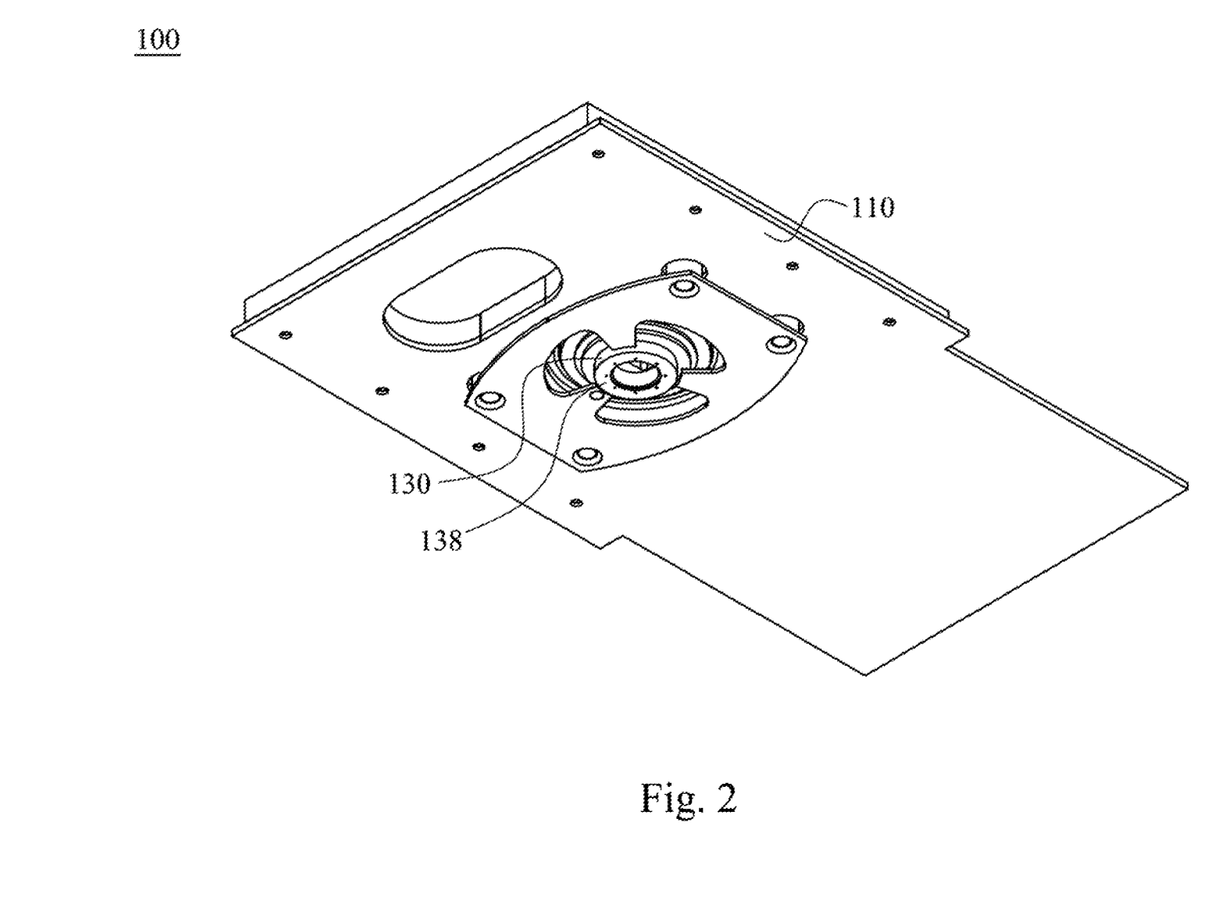
FIG. 2 is a perspective bottom view of the probe card of FIG. 1.
Figure 3:
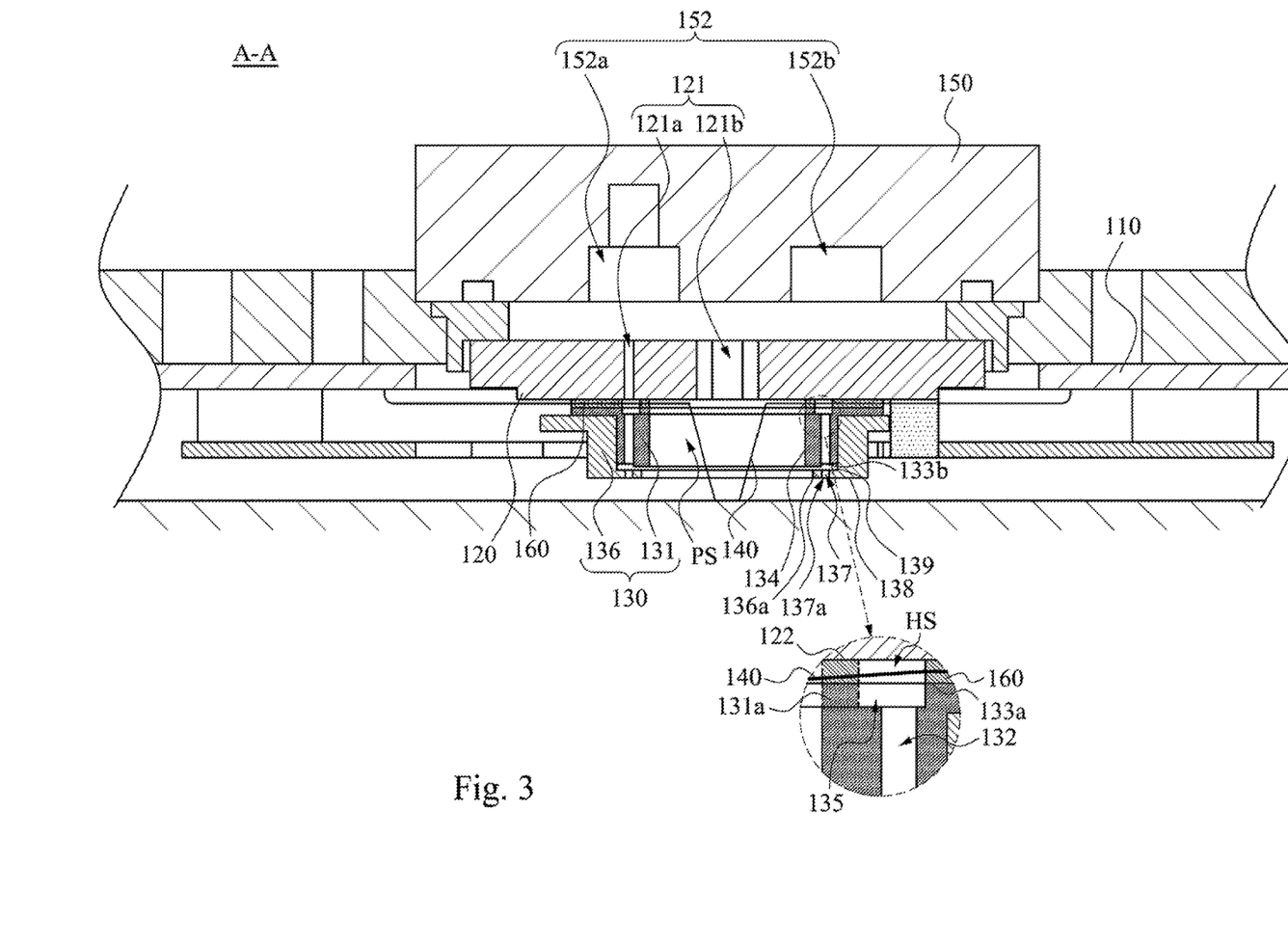
FIG. 3 is a sectional view along the sectional line A of FIG. 1.
Figure 4:
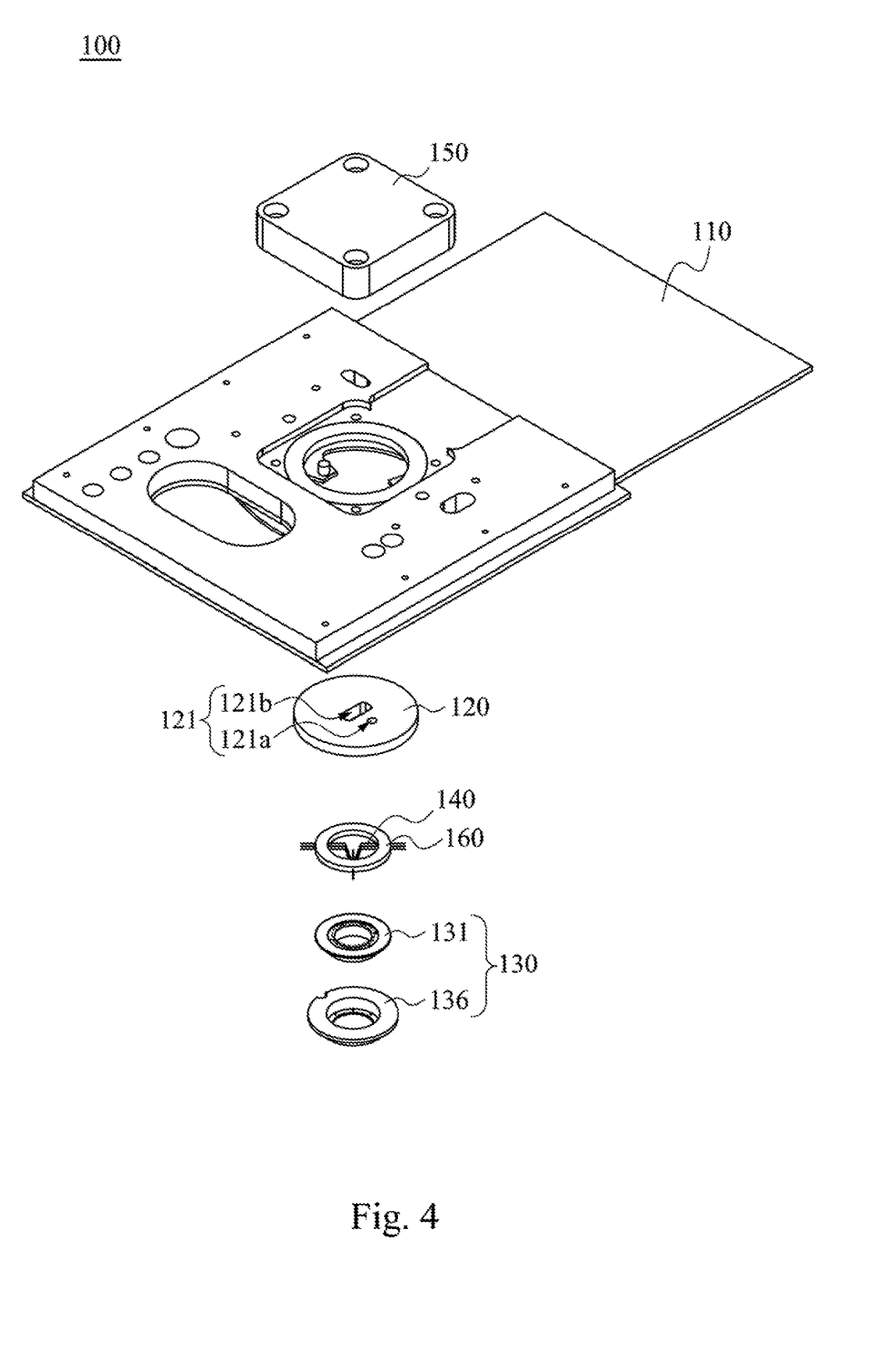
FIG. 4 is an explosive diagram of the probe card of FIG. 1.

Reference is made to FIGS. 1-6. FIG. 1 is a perspective top view of a probe card 100 according to an embodiment of the present disclosure. FIG. 2 is a perspective bottom view of the probe card 100 of FIG. 1. FIG. 3 is a sectional view along the sectional line A of FIG. 1. FIG. 4 is an explosive diagram of the probe card 100 of FIG. 1. FIGS. 5A/5B are perspective enlarged views of the first ring 131 of FIG. 4.

Figure 6:
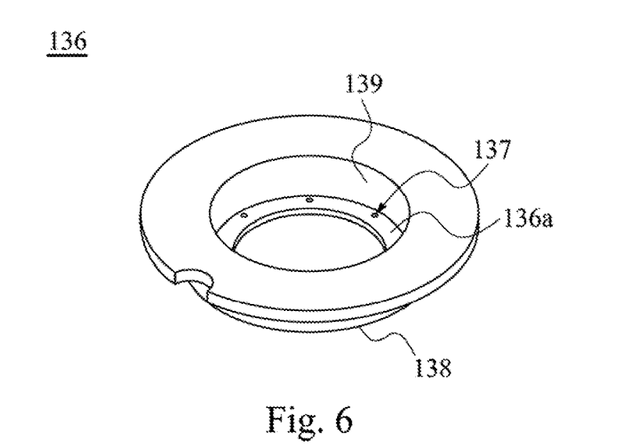
FIG. 6 is a perspective enlarged view of the second ring of FIG. 4.

FIG. 6 is a perspective enlarged view of the second ring 136 of FIG. 4. It should be noted that, for the sake of convenience of presentation, each of the elements in the figures is not necessarily to be drawn in true scale.

As shown in FIGS. 1-6, a probe card 100 includes a wiring board 110, a top cover 120, a retractable structure 130 and at least one probe 140. The top cover 120 is coupled with the wiring board 110. The top cover 120 has at least one air inlet 121 therein. The retractable structure 130 is connected with the top cover 120. The retractable structure 130 includes a first ring 131 and a second ring 136. The first ring 131 has a plurality of vent holes 132 therein. The top cover 120 has a first bottom surface 122. The first bottom surface 122 faces to the first ring 131. The first ring 131 is connected with the top cover 120. The first ring 131 has a top surface 133a. The top surface 133a faces to the top cover 120. The top surface 133a of the first ring 131 has a recess 135. The top surface 133a (or the recess 135) of the first ring 131 and the first bottom surface 122 of the top cover 120 together define a homogenized space HS in order to homogenize the air pressure or the air flow from the air inlet 121 (or the buffering air inlet 121a). The homogenized space HS communicates with the air inlet 121 of the top cover 120 and the plurality of the vent holes 132 of the first ring 131.

The second ring 136 is movably coupled with the first ring 131. The second ring 136 has an inner ring 136a and a plurality of jet holes 137. The jet holes 137 are located on the inner ring 136a which is relatively thinner. The jet holes 137 penetrate through the inner ring 136a. To be more specific, the jet holes 137 on the inner ring 136a of the second ring 136 face to the third bottom surface 133b of the first ring 131 and communicate with the vent holes 132 and the air inlet 121. The second ring 136 has a second bottom surface 138 opposite to the top cover 120. Outlets 137a of the jet holes 137 are located on the second bottom surface 138 of the second ring 136 and face to a side of a device under test (DUT). As mentioned above, the second ring 136 is movably coupled with the first ring 131. Therefore, when the second ring 136 moves away from the first ring 131 such that a larger portion of a second inner sidewall 139 of the second ring 136 is exposed from the first ring 131, a first inner sidewall 134 of the first ring 131 and the second inner sidewall 139 of the second ring 136 together define a pressure space PS. Relatively, the second ring 136 is also able to move towards the first ring 131. The probe 140 is electrically connected with the wiring board 110, and extends to the pressure space PS. In the practical applications, the probe card 100 further includes a connection adhesive 160 (please refer to FIGS. 3-4). The first ring 131 is disposed on, the top cover 120 at the top surface 133a through the connection adhesive 160. The probe 140 penetrates through the connection adhesive 160 for fixing. In some other embodiments, the connection adhesive 160 can be regarded as a part of the top cover 120.

During the utilization of the probe card 100 to carry out a high voltage (such as a voltage higher than 1500 Volt) test, the probe 140 extended to the pressure space PS is electrically connected with a high voltage source. The probe 140 is to be used to contact the device under test. In the practical applications, the device under test can be a wafer, a chip or a die. However, this does not intend to limit the present disclosure. In order to prevent the formation of a short circuit because the electric charges pass through the instantly ionized air between the probe 140 of a high voltage and other elements of the probe card 100 or another probe 140, the user can supply a highly pressurized gas (such as a pressure higher than three times of the atmospheric pressure) to the pressure space PS, so as to increase the pressure inside the pressure space PS. In this way, the chance for the formation of a short circuit between the probe 140 and other elements of the probe card 100 or another probe 140 is reduced.

As shown in FIGS. 1, 3-4, a gas supply connection plate 150 is connected with the wiring board 110. The gas supply connection plate 150 has at least one guiding hole 152 (please refer to FIG. 3) therein. An end of the guiding hole 152 communicates with a space between the gas supply connection plate 150 and the top cover 120. Another end of the guiding hole 152 is configured for communicating with a high pressure gas supply source (not shown) with a pressure for instance higher than three times of an atmospheric pressure. To be more specific, in order to supply a high pressure gas to the pressure space PS, the high pressure gas supply source can supply the high pressure gas to the pressure space PS through the guiding hole 152 of the gas supply connection plate 150 and the air inlet 121 of the top cover 120. Thus, the pressure in the pressure space PS is increased, and the chance for the formation of a short circuit between the probe 140 and other elements of the probe card 100 or another probe 140 is reduced.

On the other hand, after the gas passes through the guiding hole 152 of the gas supply connection plate 150 and flows to the air inlet 121 of the top cover 120, since the homogenized space HS communicates with the air inlet 121 of the top cover 120, at least a portion of the high pressure gas flows to the homogenized space HS. In addition, since the homogenized space HS communicates with the vent holes 132 of the first ring 131, the high pressure gas flows from the homogenized space HS to the vent holes 132 of the first ring 131. In this embodiment, the homogenized space HS communicates with the pressure space PS.

To be more specific, after the high pressure gas supply source supplies the high pressure gas to the guiding hole 152 of the gas supply connection plate 150, the high pressure gas flows to the air inlet 121 of the top cover 120. Afterwards, a portion of the high pressure gas flows to the pressure space PS, such that the pressure in the pressure space PS is increased. Meanwhile, another portion of the high pressure gas flows to the homogenized space HS, and then to the vent holes 132 of the first ring 131. As mentioned above, the jet holes 137 of the second ring 136 communicate with the vent holes 132 of the first ring 131. Therefore, the high pressure gas flowing to the vent holes 132 of the first ring 131 will flow to the jet holes 137 of the second ring 136. Moreover, since the outlets 137a of the jet holes 137 are located on the second bottom surface 138 of the second ring 136 opposite to the top cover 120, the high pressure gas flowing to the jet holes 137 of the second ring 136 will be sprayed out of the second bottom surface 138 of the second ring 136, such that a reaction force of the gas flow is formed between the second bottom surface 138 of the second ring 136 and the device under test. Consequently, the pressure formed pushes the second ring 136 to move towards the top cover 120 and float relative to the first ring 131, such that the second bottom surface 138 of the second ring 136 can move away from the device under test. In addition, the damage of the device under test due to the contact with device under test is avoided, and the status of high pressure in the pressure space PS is maintained.

Figure 5A:
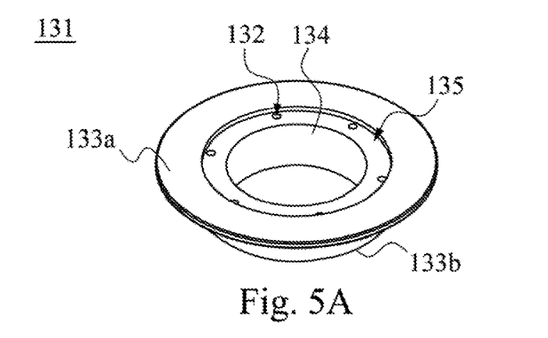
FIG. 5A is a perspective enlarged view of the first ring of FIG. 4.

On the other hand, in the structural point of view, as shown in FIGS. 3 and 5A, the top surface 133a of the first ring 131 has a recess 135 disposed inside its inner ring in an annular manner. The vent holes 132 are located in the recess 135. The vent holes 132 penetrate through the recess 135 to the third bottom surface 133b of the first ring 131, and face to the inner ring 136a of the second ring 136. In addition, the recess 135 of the top surface 133a is disposed on top of the inner ring 136a of the second ring 136. In a projecting manner, such as a projection of the recess 135 of the top surface 133a along a length direction of an inner sidewall 134 or an inner sidewall 139 to a flat surface of the inner ring 136a of the second ring 136, the recess 135 of the top surface 133a and the inner ring 136a of the second ring 136 are completely overlapped or partially overlapped (i.e., at least partially overlapped). More preferably, in a projecting manner, the recess 135 and the inner ring 136a are substantially concentric. In addition, more preferably, a quantity of the vent holes 132 is at least four or more and the vent holes 132 are evenly distributed on the recess 135. More preferably, a quantity of the jet holes 137 is at least four or more and the jet holes 137 are evenly distributed on the inner ring 136a. Therefore, the recess 135 is able to allow the high pressure gas to be distributed thereon (or the homogenized space HS) more evenly so as to facilitate the vent holes 132 to allow the high pressure gas to penetrate and flow through the first ring 131 more evenly, and to further facilitate the plurality of the jet holes 137 to allow the high pressure gas to flow through the inner ring 136a of the second ring 136 more evenly, in order to more evenly allocate the gas flow, balance and float the second ring 136. More preferably, the plurality of the vent holes 132 is substantially concentric, or located within a range of a circumference together. More preferably, the plurality of the jet holes 137 is substantially concentric. More preferably, in a projecting manner, the plurality of the vent holes 132 and the plurality of the jet holes 137 are substantially concentric. In some of the embodiments, since the top cover 120 is of a ceramic material, the recess 135 can be considered to be manufactured in the first ring 131 for the sake of manufacturing convenience. However, this does not intend to limit the present disclosure. In some other embodiments, the recess 135 can be considered to be manufactured in the top cover 120 and can be disposed in an annular manner. Moreover, the depth and width of the recess 135 and the quantity and dimension of the plurality of the vent holes 132 and the plurality of the jet holes 137, can be flexibly adjusted according to the required distance of the second ring 136 relative to the device under test, the moving speed and the degree of stability of the second ring 136, the pressure required for the side of the device under test, and/or the pressure difference between the side of the device under test and the pressure space PS or the high pressure gas supply source.

Figure 5B:
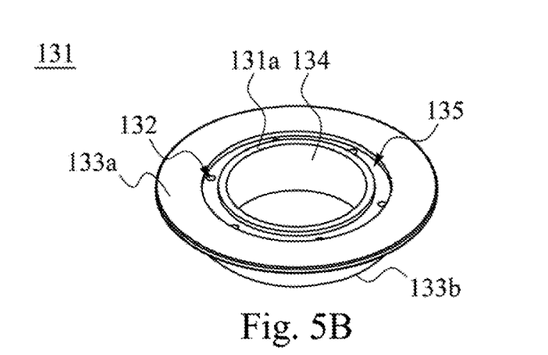
FIG. 5B is a perspective enlarged view of the first ring of FIG. 4.

To be more specific, as shown in FIGS. 3-4, the top cover 120 has a plurality of air inlets 121 therein. In this embodiment, at least one of the air inlets 121 is a buffering air inlet 121a. The buffering air inlet 121a communicates with the homogenized space HS. More preferably, the buffering air inlet 121a can be disposed to annularly correspond and communicate with the recess 135 or the plurality of the vent holes 132 after the gas gets in in order to spray the gas more evenly to the homogenized space HS. On the other hand, at least another one of the air inlets 121 is a pressure air inlet 121b. The pressure air inlet 121b communicates with the pressure space PS. In addition, please refer to FIG. 5B. FIG. 5B is a perspective enlarged view of the first ring 131 according to another embodiment of the present disclosure. In this embodiment, as shown in FIG. 5B, the recess 135 can be an annular recess embedded on the top surface 133a of the first ring 131. This means that the recess 135 is located in a middle portion of the top surface 133a of the first ring 131. This also means that the annular portion 131a of the top surface 133a near to the inner sidewall 134 is not recessed as the recess 135 does and is coplanar with a peripheral portion of the top surface 133a (or not coplanar but higher than the recess 135). The annular portion 131a of the top surface 133a near to the inner sidewall 134 can also be disposed to the top cover 120 through the connection adhesive 160. Thus, the buffering air inlet 121a directly communicates with the recess 135 and the plurality of the vent holes 132 to get homogenized, and substantially isolating at the homogenized space HS from the effect of the gas of the pressure air inlet 121b to the homogenized space HS of the recess 135. The plurality of the vent holes 132 can communicate with the pressure space PS after penetrating through the third bottom surface 133b of the first ring 131. It should be noted that, the annular portion (marked as the annular portion 131a in FIGS. 3, 7-8) presented by the hidden lines in FIGS. 3-4, 7-9 and 11-12, means that in some embodiments, the first ring 131 can have the annular portion 131a as implemented in FIG. 5B. In some other embodiments, the annular portion 131a and the connection adhesive 160 above can be not disposed, as implemented in FIG. 5A.

Similarly, as shown in FIG. 3, the gas supply connection plate 150 has a plurality of guiding holes 152 therein. In this embodiment, at least one of the guiding holes 152 is a buffering guiding hole 152a. The buffering guiding hole 152a is opposite to the buffering air inlet 121a. At least another one of the guiding holes 152 is a pressure guiding hole 152b. The pressure guiding hole 152b communicates with the pressure air inlet 121b. This means, the high pressure gas supply source can be separately connected with two branches. One of the branches is connected with the pressure guiding hole 152b, such that a portion of the high pressure gas flows to the pressure air inlet 121b of the top cover 120. Another one of the branches is connected with the buffering guiding hole 152a of the gas supply connection plate 150, such that another portion of the high pressure gas flows to the buffering air inlet 121a of the top cover 120. The high pressure gas flowing to the pressure air inlet 121b flows to the pressure space PS, such that the pressure in the pressure space PS is increased. The high pressure gas flowing to the buffering air inlet 121a flows to the homogenized space HS, and then to the vent holes 132 of the first ring 131. Through the mechanism as mentioned above, the second ring 136 is pushed to move towards the top cover 120 relative to the first ring 131, such that the second bottom surface 138 of the second ring 136 can be away from the device under test. With the buffering air inlet 121a and the pressure air inlet 121b in the top cover 120, the user can conveniently use the independent branches of the high pressure gas supply source, to respectively guide the high pressure gas to the homogenized space HS and the pressure space PS, in order to achieve at the same time both the purposes of moving the second bottom surface 138 of the second ring 136 away from the device under test and increasing the pressure in the pressure space PS.

Figure 7:
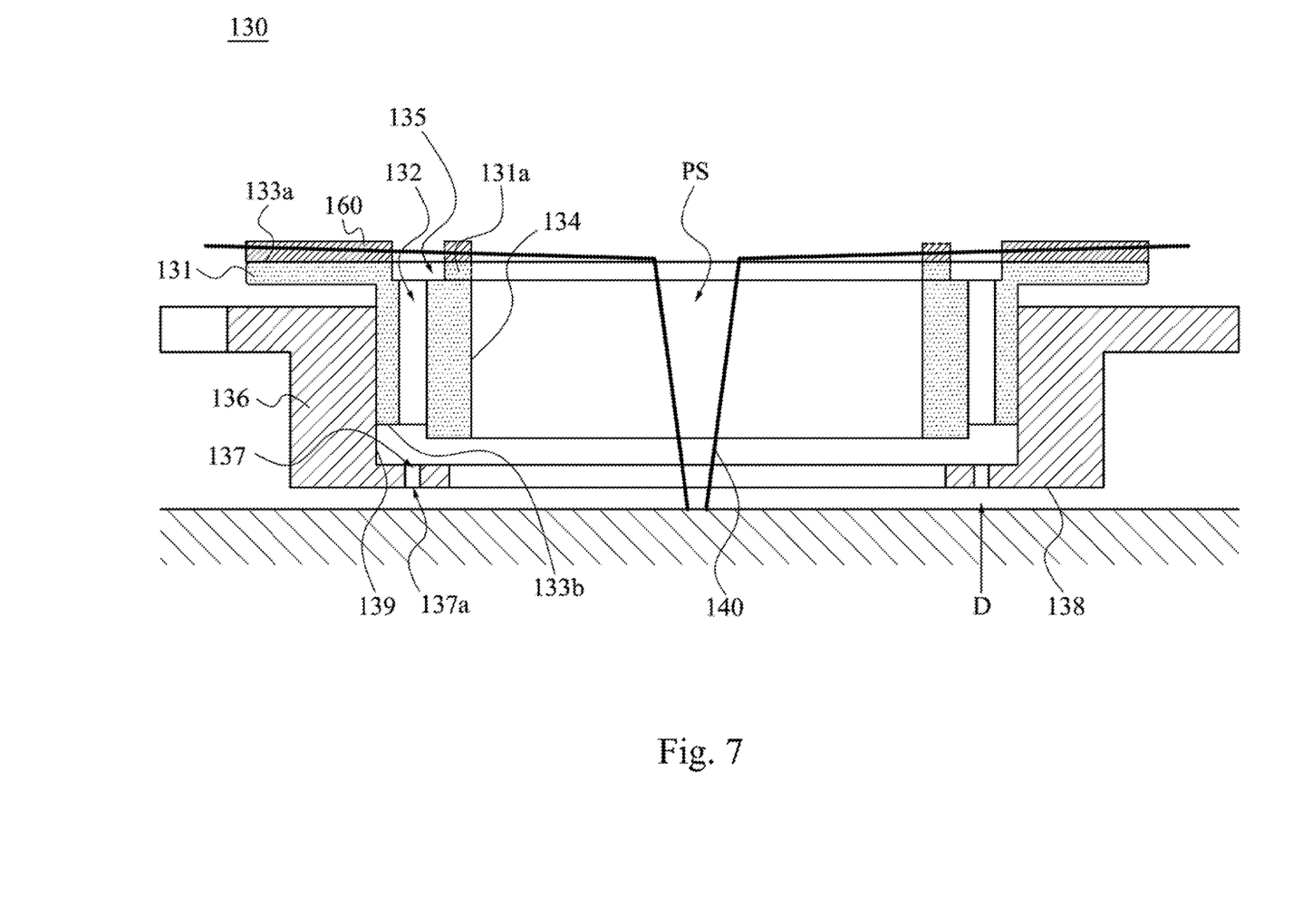
FIG. 7 sectional view of the retractable structure of FIG. 4.

Please refer to FIG. 7. FIG. 7 is a sectional view of the retractable structure 130 of FIG. 4. In this embodiment, as shown in FIG. 7, the length direction D of each of the jet holes 137 of the second ring 136 is substantially perpendicular to the second bottom surface 138 of the second ring 136.

Figure 8:
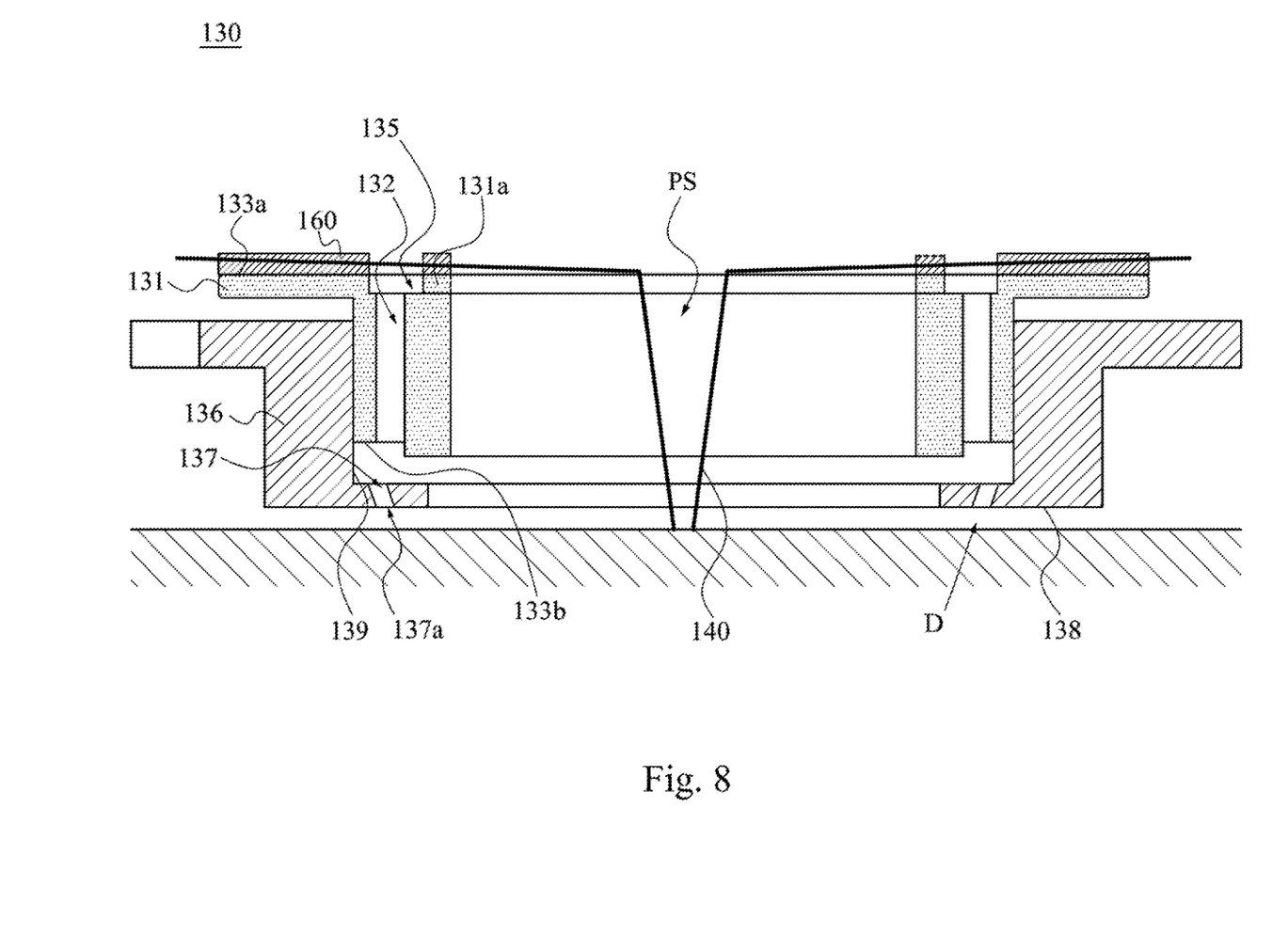
FIG. 8 is a sectional view of a retractable structure according to another embodiment of the present disclosure.

Please refer to FIG. 8. FIG. 8 is a sectional view of a retractable structure 130 according to another embodiment of the present disclosure. As shown in FIG. 8, in this embodiment, the length direction D of each of the jet holes 137 of the second ring 136 inclines outwards from the second bottom surface 138 to the pressure space PS. In some embodiments, the length direction D of each of the jet holes 137 of the second ring 136 inclines inwards from the second bottom surface 138 to the pressure space PS, in which an angle of inclination is larger than about 1 degree but smaller than about 10 degree.

In general, the parameters such as the quantity and the dimension of the jet holes 137 of the second ring 136, the requirement of inclination, the angle and the direction of inclination, the speed of the gas to be sprayed, can be adjusted according to the actual situations. To be more specific, the manufacturer can flexibly adjust the parameters such as the quantity and the dimension of the jet holes 137 of the second ring 136, the requirement of inclination, the angle and the direction of inclination and the speed of the gas to be sprayed, according to the required distance of the second ring 136 relative to the device under test, the moving speed and the degree of stability of the second ring 136, the pressure required for the side of the device under test, and/or the pressure difference between the side of the device under test and the pressure space PS or the high pressure gas supply source.

Figure 9:
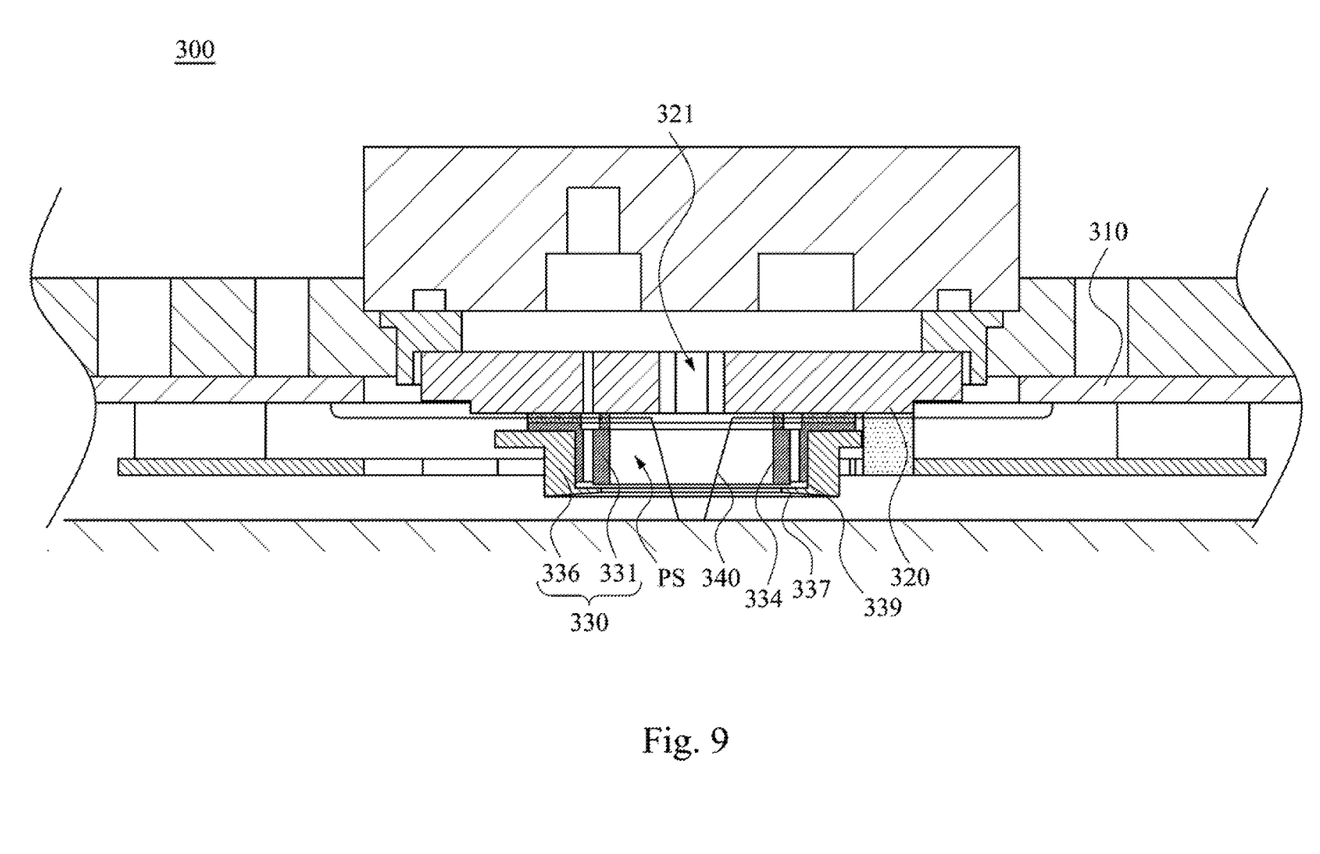
FIG. 9 is a sectional view of a probe card according to a further embodiment of the present disclosure.
Figure 10:
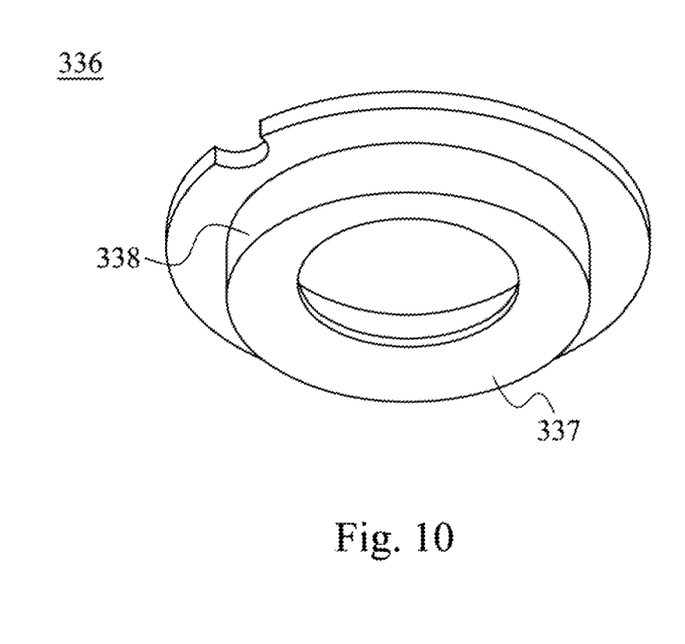
FIG. 10 is a perspective enlarged view of the second ring of FIG. 9.
Figure 11:
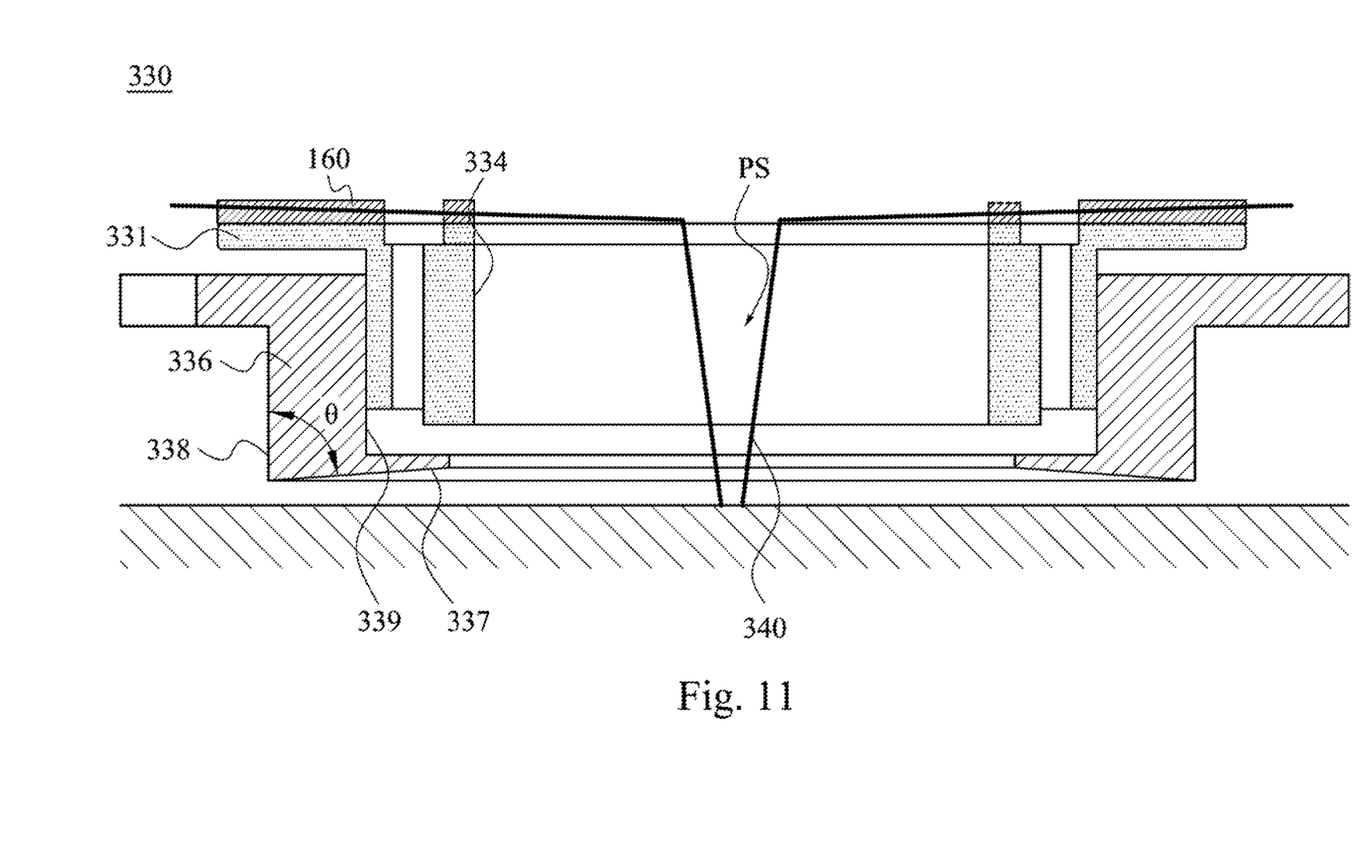
FIG. 11 is a sectional view of the retractable structure of FIG. 9.

Please refer to FIGS. 9-11. FIG. 9 is a sectional view of a probe card 300 according to a further embodiment of the present disclosure. FIG. 10 is a perspective enlarged view of the second ring 336 of FIG. 9. FIG. 11 is a sectional view of the retractable structure 330 of FIG. 9. FIGS. 9-11, a probe card 300 includes a wiring board 310, a top cover 320, a retractable structure 330 and a probe 340. The top cover 320 is coupled with the wiring board 310. The top cover 320 has at least one air inlet 321 therein. The retractable structure 330 includes a first ring 331 and a second ring 336. The first ring 331 is connected with the top cover 320. The second ring 336 is movably coupled with the first ring 331. The second ring 336 has an inclined bottom surface 337 opposite to the top cover 320. A first inner sidewall 334 of the first ring 331 and a second inner sidewall 339 of the second ring 336 together define a pressure space PS. The probe 340 is electrically connected with the wiring board 310, and extends to the pressure space PS.

In addition, as shown in FIG. 11, an angle θ between the inclined bottom surface 337 of the second ring 336 and an outer wall 338 of the second ring 336 is an acute angle. This means the angle 9 formed between the inclined bottom surface 337 of the second ring 336 and an outer wall 338 of the second ring 336 is less than about 90 degree. For example, the range of the included angle 9 is larger than or equal to about 82 degree but smaller than or equal to about 89 degree. This also means that an inclined angle of the inclined bottom surface 337 relative to the device under test can be configured to be between about 1 degree and about 8 degree. In this way, a portion of the high pressure gas flowing through the vent holes 132 or the air inlets 321 to the pressure space PS will flow and leave the pressure space PS along the inclined bottom surface 337 of the second ring 336, a reaction force is formed between the inclined bottom surface 337 of the second ring 336 and the device under test. Consequently, the pressure formed pushes the second ring 336 to move towards the top cover 320 relative to the first ring 131, such that the inclined bottom surface 337 of the second ring 336 can be away from the device under test. In addition, the damage of the device under test due to the contact with device under test is avoided, and the status of high pressure in the pressure space PS is maintained.

Figure 12:
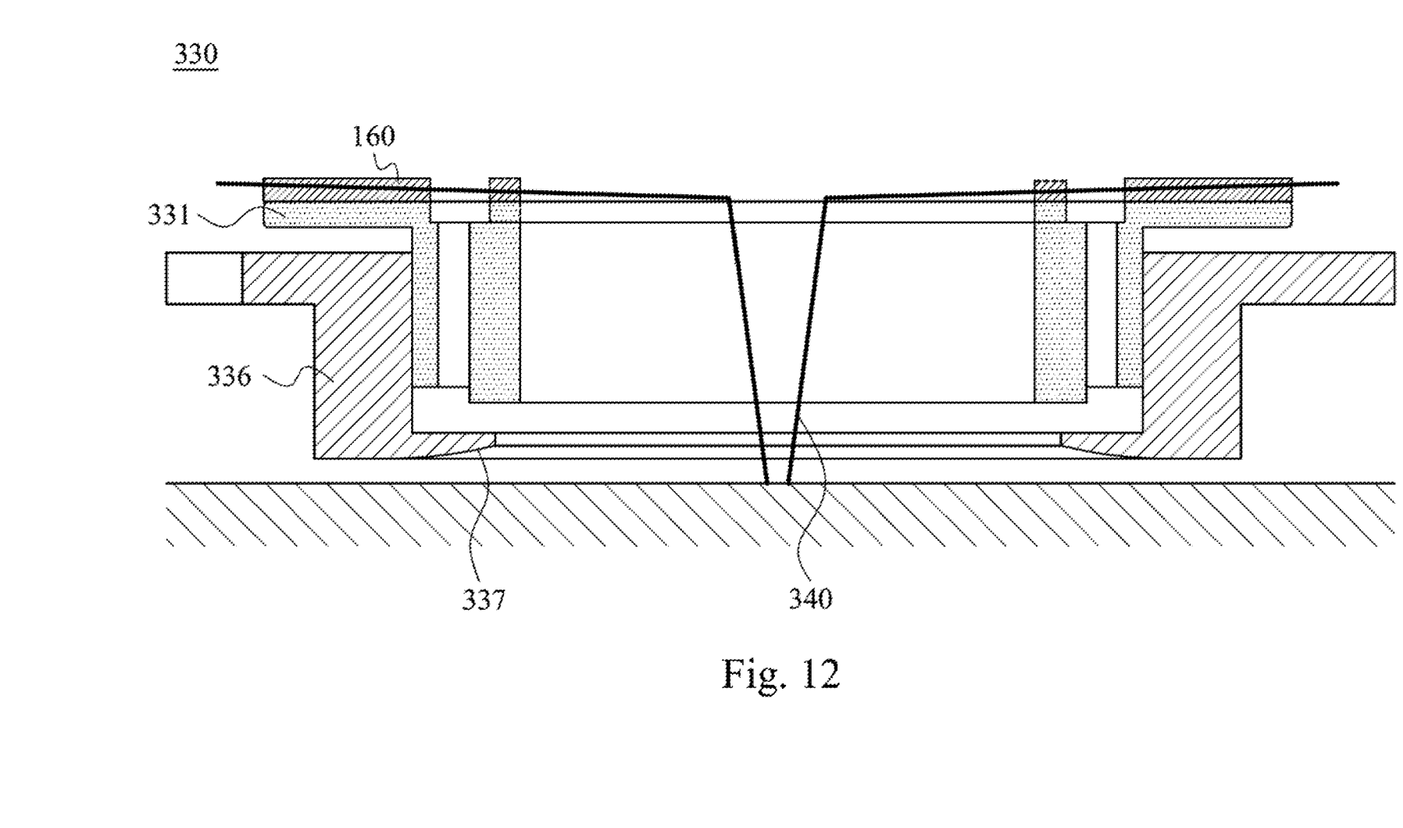
FIG. 12 is a sectional view of a retractable structure according to another further embodiment of the present disclosure.

Please refer to FIG. 12. FIG. 12 is a sectional view of a retractable structure 330 according to another further embodiment of the present disclosure. In this embodiment, as shown in FIG. 12, the inclined bottom surface 337 of the second ring 336 can be a curved surface.

In general, the parameters such as the direction and the angle of the inclined bottom surface 337 of the second ring 336 the requirement for a flat surface or a curved surface of the inclined bottom surface 337 of the second ring 336, and the speed of the gas passing through can be adjusted according to the actual situations. To be more specific, the manufacturer can flexibly adjust the parameters such as the direction and the angle of the inclined bottom surface 337 of the second ring 336, the requirement for a flat surface or a curved surface of the inclined bottom surface 337 of the second ring 336, and the speed of the gas passing through, according to the required distance of the second ring 336 relative to the device under test, the moving speed and the degree of stability of the second ring 336, the pressure required for the side of the device under test, and/or the pressure difference between the side of the device under test and the pressure space PS or the high pressure gas supply source.

In conclusion, when compared with the prior art, the embodiments of the present disclosure mentioned above have at least the following advantages:

(1) With the reaction force of the gas flow formed between the second bottom surface of the second ring and the device under test to push the second ring to move towards the top cover relative to the first ring, the second bottom surface of the second ring can move away from the device under test. This is suitable to be used in a high gas pressure environment to increase the high voltage tolerance and to improve the testing performance. Moreover, the damage of the device under test due to the contact with device under test is avoided.

(2) The embodiment above makes use of the recess of the top surface and the plurality of vent holes of the first ring to better homogenize the gas flow. Moreover, the processing is easy.

(3) In the embodiment above, the inner ring or the second bottom surface of the second ring is exposed at the bottom. Thus, the processing is also easy.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A probe card, comprising:
a wiring board;
a top cover coupled with the wiring board, the top cover having at least one air inlet therein;
a retractable structure connected with the top cover, the retractable structure comprising:
a first ring having a plurality of vent holes therein, the top cover having a first bottom surface facing to the first ring, the first ring having a top surface facing to the top cover, the top surface of the first ring and the first bottom surface of the top cover together defining a homogenized space, the homogenized space communicating with the air inlet of the top cover and the vent holes of the first ring; and a second ring movably coupled with the first ring, the second ring having an inner ring extending inwardly from a second inner sidewall of the second ring and a plurality of jet holes penetrating through the inner ring, a projection of each of the vent holes along an extension direction of the corresponding vent hole overlapping with the inner ring and the jet holes communicating with the vent holes, the second ring having a second bottom surface on the inner ring and opposite to the top cover, outlets of the jet holes being located on the second bottom surface, wherein a first inner sidewall of the first ring and the second inner sidewall of the second ring together define a pressure space; and at least one probe electrically connected with the wiring board and extending to the pressure space.

2. The probe card of claim 1, wherein a quantity of the air inlet is plural, one of the air inlets is a buffering air inlet communicating with the homogenized space, another one of the air inlets is a pressure air inlet communicating with the pressure space.

3. The probe card of claim 1, wherein an included angle between the second bottom surface of the second ring and an outer wall of the second ring is an acute angle.

4. The probe card of claim 1, wherein a length direction of each of the jet holes inclines an angle from the second bottom surface to the pressure space, the angle is larger than about 1 degree but smaller than about 10 degrees.

5. The probe card of claim 1, wherein the top surface of the first ring has a recess, the recess and the first bottom surface of the top cover together define the homogenized space, the vent holes penetrate through the recess to a third bottom surface of the first ring.

6. The probe card of claim 1, further comprising:
a holder connected to the wiring board, the holder having a through hole and the second ring at least partially penetrating through the through hole.

7. The probe card of claim 6, wherein the second ring has an outer ring extended outwardly from an outer sidewall of the second ring, the outer ring is at least partially located between the holder and the top cover.

8. A probe card, comprising:
a wiring board;
a top cover coupled with the wiring board, the top cover having at least one air inlet therein;
a retractable structure, comprising:
a first ring connected with the top cover and having a plurality of vent holes therein; and
a second ring movably coupled with the first ring, the second ring having an inner ring extending inwardly from a second inner sidewall of the second ring and having an inclined bottom surface disposed opposite to the top cover and partially on the inner ring, a projection of each of the vent holes along an extension direction of the corresponding vent hole overlapping with the inner ring, a first inner sidewall of the first ring and the second inner sidewall of the second ring together defining a pressure space; and at least one probe electrically connected with the wiring board and extending to the pressure space.

9. The probe card of claim 8, wherein an angle between the inclined bottom surface of the second ring and an outer wall of the second ring is larger than or equal to about 82 degrees but smaller than or equal to about 89 degrees.

10. The probe card of claim 8, wherein a top surface of the first ring has a recess, and the first ring has a plurality of vent holes penetrating through the recess to a bottom surface of the first ring and communicating with the pressure space.

11. The probe card of claim 8, further comprising:
a holder connected to the wiring board, the holder having a through hole and the second ring at least partially penetrating through the through hole.

12. The probe card of claim 11, wherein the second ring has an outer ring extended outwardly from an outer sidewall of the second ring, the outer ring is at least partially located between the holder and the top cover.

13. A probe card, comprising:
a wiring board;
a top cover coupled with the wiring board, the top cover having at least one air inlet therein;
a retractable structure connected with the top cover, the retractable structure comprising:
a first ring disposed on the top cover, the first ring having a plurality of vent holes and a recess; and
a second ring movably coupled with the first ring, the second ring having an inner ring extending inwardly from a second inner sidewall of the second ring and a plurality of jet holes, the vent holes penetrating through the recess to a bottom surface of the first ring, a projection of each of the vent holes along an extension direction of the corresponding vent hole overlapping with the inner ring, the jet holes penetrating through the inner ring and communicating with the vent holes and the air inlet, wherein a first inner sidewall of the first ring and the second inner sidewall of the second ring together define a pressure space, the recess and the inner ring at least partially overlapping in a projecting manner; and at least one probe electrically connected with the wiring board and extending to B the pressure space.

14. The probe card of claim 13, further comprising:
a holder connected to the wiring board, the holder having a through hole and the second ring at least partially penetrating through the through hole.

15. The probe card of claim 14, wherein the second ring has an outer ring extended outwardly from an outer sidewall of the second ring, the outer ring is at least partially located between the holder and the top cover.

* * * * *